United States Patent [19]

Enoki et al.

[11] Patent Number: 4,694,564
[45] Date of Patent: Sep. 22, 1987

[54] METHOD FOR THE MANUFACTURE OF A SCHOTTKY GATE FIELD EFFECT TRANSISTOR

[76] Inventors: Takatomo Enoki, Soubudai-Ryo, 2-183, Soubudai, Zama-shi, Kanagawa 228; Kimiyoshi Yamasaki, Denden 5-101, 861-1, Ishida, Isehara-shi, Kanagawa 259-11; Kuniki Ohwada, 1074-47, Katakura-cho, Hachioji-shi, Tokyo 192, all of Japan

[21] Appl. No.: 887,211

[22] Filed: Jul. 21, 1986

[30] Foreign Application Priority Data

Jul. 29, 1985 [JP] Japan ................... 60-167304

[51] Int. Cl.⁴ .......................................... H01L 21/467
[52] U.S. Cl. ......................................... 437/40; 357/15;
148/DIG. 139; 156/643; 156/656; 437/175;
437/245
[58] Field of Search ................. 29/571, 578, 580, 591,
29/589; 357/15; 148/DIG. 139; 156/643, 648,
656

[56] References Cited

U.S. PATENT DOCUMENTS 4,213,840 7/1980 Omori et al. ........................ 357/15
4,499,651 2/1985 Kohn ................................... 29/571
4,503,600 3/1985 Nii et al. ............................. 29/571

FOREIGN PATENT DOCUMENTS 0103355 6/1984 Japan ..................................... 29/589
0006871 1/1986 Japan ..................................... 29/571

Primary Examiner—Brian E. Hearn
Assistant Examiner—T. N. Quach
Attorney, Agent, or Firm—Staas & Halsey

[57] ABSTRACT

In the manufacture of a Schottky gate field effect transistor, an insulating film is deposited on the main surface of a semiconductor substrate and is then selectively removed to form therein a window through which the substrate surface region for forming an active layer is exposed to a space in which the gate will ultimately be provided. A metal which forms a Schottky junction between it and the semiconductor of the active layer and can be removed by anisotropic etching and a metal which can be used as a mask for the etching of the above metal are deposited in layers on the insulating film and the substrate surface exposed through the window. The overlying metal layer thus deposited is planarized to leave in the window alone. The underlying metal layer is selectively removed by anisotropic etching through the overlying metal layer remaining in the window, thus forming a gate electrode made up of the overlying and underlying metal layers. The structure thus obtained is small in the overlapping of the gate electrode on the adjoining insulating films, ensuring the reduction of parasitic capacitances to thereby speed up the operation of the device.

6 Claims, 28 Drawing Figures

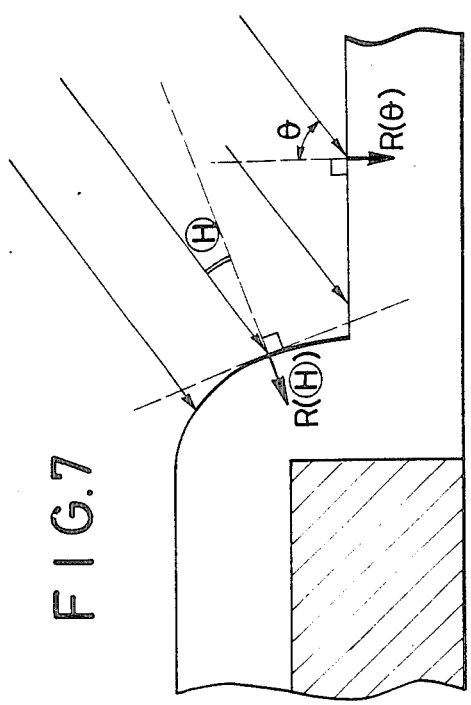
F I G. 7
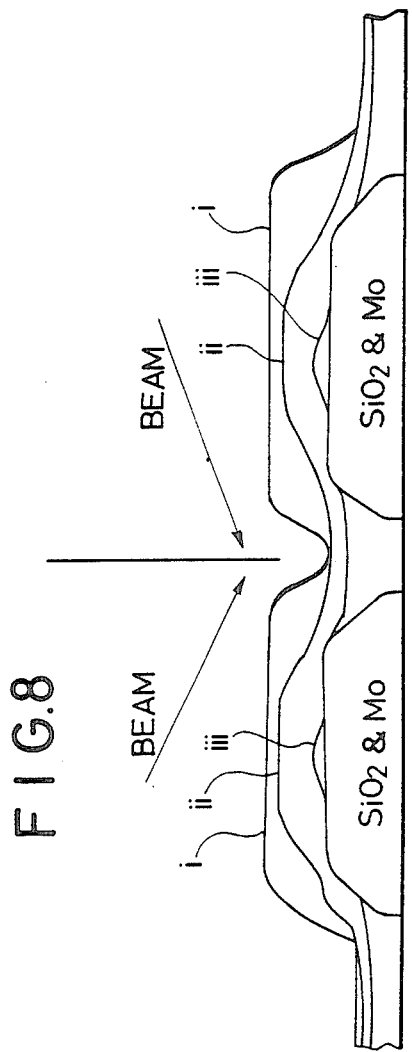
F I G. 8

METHOD FOR THE MANUFACTURE OF A SCHOTTKY GATE FIELD EFFECT TRANSISTOR

BACKGROUND OF THE INVENTION

1. Field of the Invention

The present invention relates to a method for the manufacture of a field effect transistor which has an active layer of a gate region and ion-implanted source and drain regions formed in the main surface of a semiconductor substrate.

2. Description of the Prior Art

A Schottky junction gate type field effect transistor (hereinafter referred to as an MESFET) utilizing a compound semiconductor such as GaAs has been employed widely as a discrete semiconductor component part for a high frequency, an oscillator, and so forth; at present, it is playing an important role as a basic element of high frequency and high speed integrated circuits as well. As is well-known in the art, the high frequency performance of such an MESFET is described in the form of a ratio, Gm/Cg, where Gm and Cg are its transconductance and gate capacitance, respectively. The high frequency performance could be improved by increasing the transconductance Gm relative to the gate capacitance Cg. It is well-known that the effective transconductance Gm of the MESFET is given by $Gm = Gm_0/(1 + Gm_0 \cdot Rs)$, where $Gm_0$ is the intrinsic transconductance dependent upon the characteristic of the channel part and Rs is the parasitic series resistance between the source and gate. As seen from the above, the presence of the parasitic series resistance Rs makes the effective transconductance Gm smaller than the intrinsic transconductance $Gm_0$. Accordingly, how to reduce the parasitic series resistance Rs is a key for obtaining a large transconductance to improve the high frequency performance.

A known technique for diminishing the parasitic series resistance Rs is self-alignment technology for the formation of the gate-Schottky junction and the source and drain regions. This can be achieved in several ways; a typical example is shown in FIG. 9 (K. Yamasaki et al., Electron Lett. 18(3), (1982), pp 119-121). An N type impurity, for example, silicon is selectively ion implanted into the main surface of a GaAs or semi-insulating compound semiconductor substrate 11, forming therein a primary ion-implanted layer 12 which will ultimately serve as an active layer (FIG. 9A). A silicon nitride film 13 is deposited 0.15 μm thick all over the main surface of the substrate 11 through plasma CVD method, for instance. Further, a resist layer 14 of a tri-level structure made up of, for example, a resist film $14_1$, an insulating film $14_2$ as of $SiO_2$, and a resist film $14_3$ is formed on the silicon nitride film 13.

Next, the uppermost resist film $14_3$ of the tri-level resist layer 14 is patterned by photolithography, after which the intermediate insulating film $14_2$ and the lowermost resist film $14_1$ are selectively removed in succession by reactive ion etching or the like using the patterned resist film $14_3$ as a mask, whereby apertures are made in a region where to provide the source and drain, thus partly exposing the silicon nitride film 13 through the apertures. Following this, an N type impurity, for instance, silicon, is selectively ion implanted into the substrate 11 through the tri-level resist layer 14 acting as a mask, by which is formed high impurity concentration ion-implanted layers 15 having an impurity concentration approximately 10 times higher than that of the primary ion-implanted layers 12 (FIG. 9B). Then a $SiO_2$ film 16 is deposited, for example, 0.3 μm thick over the entire area of the main surface of the substrate 11. Thereafter, the $SiO_2$ film 16 deposited on the tri-level resist layer 14 alone is removed by a lift-off process together with the latter, leaving the $SiO_2$ film 16 on the silicon nitride film 13 except for the portion covered with the lowermost resist film $14_1$ (FIG. 9C). As a result of this, the $SiO_2$ film 16 remains unremoved almost right above each of the high impurity concentration ion-implanted layers 15. In this instance, if the tri-level resist layer 14 is selectively etched in such a T-letter shape, as a whole, that the lowermost resist film $14_1$ is side-etched as compared with the intermediate film $14_2$, as depicted in FIG. 9B, then the abovesaid $SiO_2$ film 16 will be formed overhanging the inner end of each high impurity concentration ion-implanted layer 15 accordingly. Next, the substrate assembly is annealed, for instance, in an $N_2$ atmosphere at 800° C. for 20 minutes for activating the ion-implanted layers 15. After this, a resist pattern which has windows on positions corresponding to source and drain electrodes is formed all over the main surface of the substrate 11 with the silicon nitride film 13 and the $SiO_2$ film 16 deposited thereon. The silicon nitride film 13 and the $SiO_2$ 16 are selectively removed by, for example, reactive ion etching and plasma etching through the resist pattern. Following this, an ohmic contact electrode material, for instance, AuGe/Ni, is vacuum evaporated through the above resist pattern and then lifted off together with the resist pattern, after which the remaining portions of the deposited metal are alloyed, providing a source electrode 17 and a drain electrode 18. Next, a resist pattern which has a window only at a position corresponding to a gate electrode is deposited all over the main surface of the substrate 11, through which pattern the silicon nitride film 13 is selectively etched away to expose the surface of the ion-implanted layer 12, through an etching process which etches the silicon nitride film 13 at a higher rate than the $SiO_2$ film 16, such as the plasma etching or reactive ion etching process. Next, a metal which will form a Schottky junction between it and the GaAs substrate 11 is deposited on the exposed surface of the ion-implanted layer 12 and an unnecessary part of the deposited metal is lifted off together with the resist pattern, thus forming a gate electrode 19 (FIG. 9D).

The self-aligned MESFET thus obtained is, however, defective in that the gate electrode 19 overrides the insulating film 16 on either side thereof. With such a structure, the capacitance Cg between the gate electrode 19 and the channel layer is given by $Cg = Cj + 2Cp$, i.e. the sum of the junction capacitance Cj and a parasitic capacitance Cp bwtween the electrode portion overriding the insulating layer 16 and the channel, as schematically shown in FIG. 10. In this case, an increase in the capacitance Cg will degrade the high frequency and high speed characteristics of the device, impairing the performance of the GaAs IC.

SUMMARY OF THE INVENTION

It is therefore an object of the present invention to provide a field effect transistor manufacturing method which permits the reduction of the overlapping of the gate electrode and the adjoining insulating films so that the parasitic capacitances resulting from the above overlapping is eliminated for speeding up the operation of the field effect transistor.

According to the present invention, in the self-aligned formation of the gate electrode, an insulating film is deposited all over the main surface of a semiconductor substrate and is then selectively removed to form therein an aperture through which an active layer in the substrate is exposed to a space where to form a gate. A composite layer, which is made up of an underlying layer of a metal which forms a Schottky junction between it and the semiconductor substrate and can be removed by anisotropic etching and at least one overlying layer of a metal which can be used as a mask for the etching of the above-said underlying metal layer, is deposited as a layer of gate metal, filling up the aperture. Then the surface of the overlying metal layer is planarized and/or it is further overetched so that the overlying metal layer remains in the aperture. The underlying metal layer is selectively removed by anisotropic etching through the overlying metal remaining in the aperture, thus forming the gate electrode on the exposed active layer.

In general, the aperture made in the insulating film gradually spreads open upward. On the other hand, according to the method described above, when the aperture is filled up with the composite layer as the gate metal layer and the layer is planarized, the overlying metal layer remaining in the aperture lies on the exposed surface of the active layer where to form the gate electrode, and the width of the overlying metal layer is smaller by the thickness of the underlying metal layer deposited on the side walls of th insulating film. Accordingly, by properly controlling the thickness of the underlying metal layer, the width of the remaining overlying metal layer can be made equal to the foot width of the exposed surface of the active layer on which the gate electrode is to be formed.

In the event that the width of the remaining overlying metal layer cannot be made equal to the foot width of the gate electrode forming portion through the thickness control of the underlying metal layer alone the overlying metal layer after being planarized is overetched so that its both marginal edges are etched back, thereby making the both widths equal to each other.

Thereafter, by the abovesaid anisotropic etching of the underlying metal layer through the remaining overlying metal layer substantially matched with the foot width of the aperture for the gate electrode forming portion, the required gate electrode can be formed on a self-aligned basis with practically no overlapping on the adjoining insulating films.

As described above, according to the present invention, the overlapping of the gate electrode on the surrounding insulating films is avoided through control of the thickness of the underlying metal layer or overetching of the overlying metal layer. That is to say, the present invention eliminates parasitic capacitances resulting from the abovesaid overlapping, and hence enables a high speed operation of the field effect transistor.

Other objects, features and advantages of the present invention will become more fully apparent from the following detailed description taken in conjuncion with the accompanying drawings.

BRIEF DESCRIPTION OF THE DRAWINGS

FIG. 7 is a diagram for explaining the principle of planarization;

FIG. 8 is a diagram showing how planarization takes place in an embodiment of the present invention;

DESCRIPTION OF THE PREFERRED EMBODIMENTS

Figure 1A:
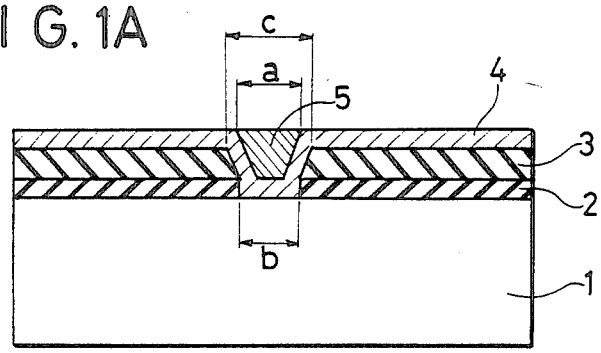
FIGS. 1A, B and C are sectional views and a plan view for explaining the concept of the present invention.
Figure 1B:
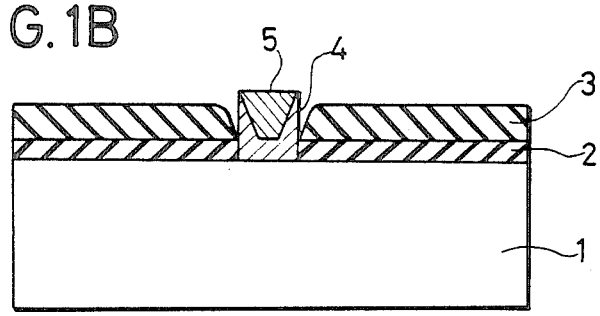
Figure 1C:
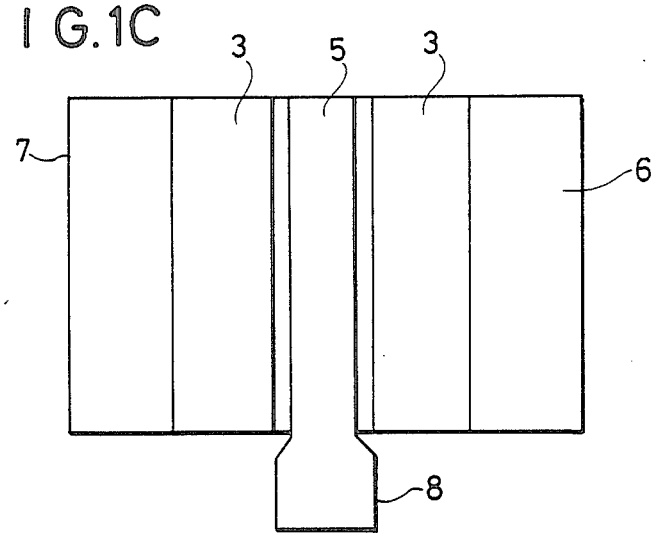

A description will be given first, with reference to FIG. 1, of a self-aligned gate electrode forming method according to the present invention. In FIG. 1 the internal structure of a semiconductor substrate 1 is not shown for the sake of brevity. The formation of such a gate electrode starts with the depostion of insulating films 2 and 3 over the entire area of the semiconductor substrate 1 so that they cover its surface region where source and drain regions will ultimately be formed, and the insulating layers 2 and 3 overlying the surface region of the substrate 1 where an active layer will ultimately be formed are selectively removed so as to form an Schottky contact region. A metal film 4, which forms a Schottky junction between it and the semiconductor substrate 1 and can be removed by anisotropic etching such as reactive ion etching, is deposited all over the main surface of the semiconductor substrate 1 covered with the insulating films 2 and 3. Then an overlying single- or multi-layer metal film 5, which can be used as a mask for the anisotropic etching of the metal film 4, is deposited thereon. The ovelying metal film 5 is planarized so that it remains only in the recess defined by the insulating films 2 and 3 (FIG. 1A), and the underlying metal film 4 is removed by reactive ion etching or similar anisotropic etching through the overlying metal layer 5 remaining in the recess. In this way, the gate electrode can be formed only in the recessed region of the insulating films 2 and 3 indicated by a foot width b. By employing such a two-layered structure for the gate electrode, it is possible to obtain a structure in which the gate electrode and the insulating films 2 and 3 do not overlap at all, as shown in FIG. 1B, even when the inner ends of the insulating film 3 are not steep. That is, the aperture width c of the recessed region defined by the insulating films 2 and 3 decreases by the thickness of the underlying metal film 4 deposited on the side walls of the insulating films 2 and 3. Accordingly, when the overlying metal layer 5 is left only in the recessed region by its planarization after being deposited, the width a of the overlying metal layer 5 becomes smaller than the before-mentioned width c. Moreover, letting the foot width of the exposed active layer be represented by b, the underlying metal film 4 has such a thickness that a=b. In this instance, colective removal of the underlying metal film 4 by anisotropic etching through the overlying metal layer 5 remaining in the recessed region will provide such a structure as depicted in FIG. 1B which is entirely free from overlapping of the gate electrode and the insulating films 2 and 3. Furthermore, according to this manufacturing method, since the material for planarization is also metal, the cross-sectional area of the gate metal remaining in the recessed region is larger than in the case of using resist or an insulating film such as a nitride film for planarization (Japanese Patent Application No. 247019/74, for example); this brings about the advantage of lowered gate resistance as well. FIG. 1C is a plane view of the structure shown in FIG. 1B, which the insulating films are partly removed and source and drain electrodes 6 and 7 are provided. The gate electrode 5 is let out and a pad 8 is mounted thereon.

Figure 2A:
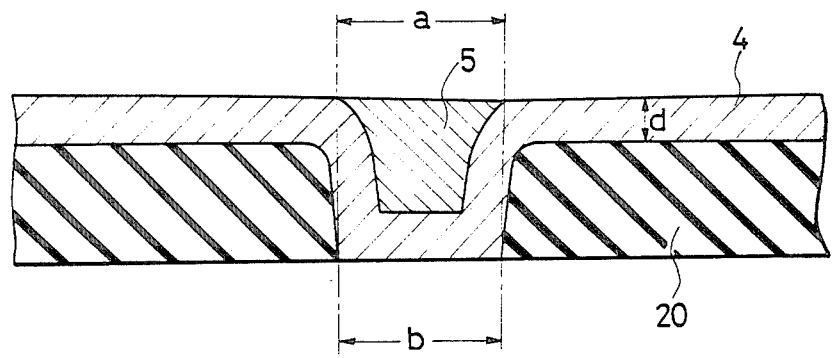
FIGS. 2A and B are cross-sectional views for explaining the principles of the present invention.
Figure 2B:
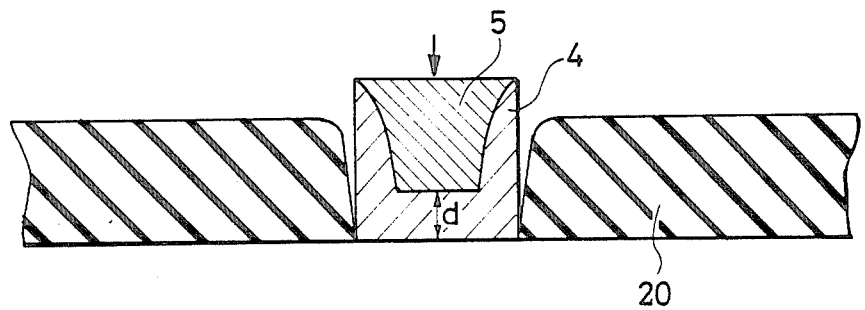

FIG. 2 illustrates in cross-section the structure in which a metal capable of acting as a mask for reactive ion etching or the like is deposited as the overlying metal layer 5 and is planarized. As depicted in FIG. 2A in which the thickness of the underlying metal layer 4 is represented by d, the width a of the gate electrode 5 can be made substantially equal to the foot width b by optimizing the relationship between the angle of inclination of the side wall of the recess and the thickness of an insulating film 20 (indicating both of the films 2 and 3 in FIG. 1), or by determining conditions through preliminary experiments. As depicted FIG. 2B by selectively removing the metal film 4 by anisotropic etching such as reactive ion etching through the metal layer 5, the gate electrode can be formed only on the region indicated by the foot width b of the insulating film 20, with the marginal edges of the gate electrode tapering off at the upper edges of the insulating film 20.

Figure 3A:
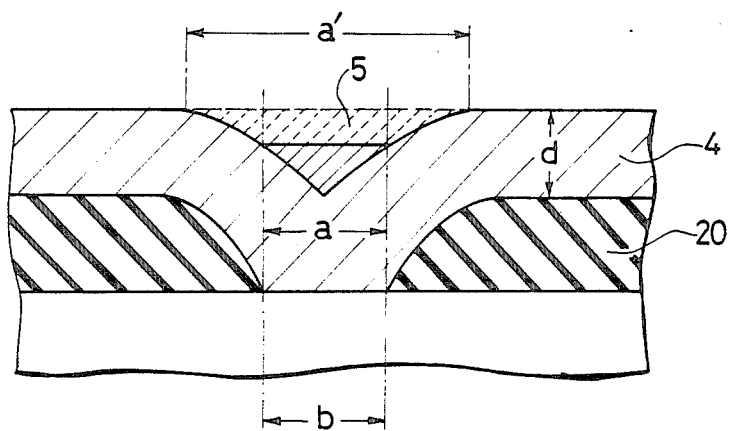
FIGS. 3A, B and C are cross-sectional views for further explaining the principles of the present invention.
Figure 3B:
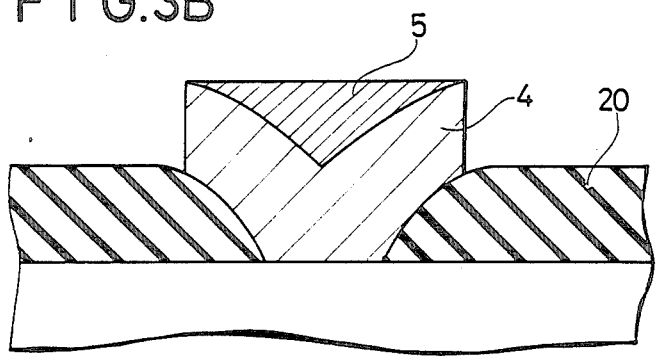

As illustrated in FIG. 3, however, the case where the recess in the insulating film 20 is not sharp in its cross-sectional profile, that is, where the inner edges of the insulating film 20 are dull, the overlying metal layer 5 on the underlying metal film 4, when planarized, will overlap the insulating film 20, as indicated by a' in FIG. 3A. In this case, if the underlying metal film 4 is subjected to anisotropic etching through the overlying metal layer 5, then the pattern of the metal layers 4 and 5 will override the insulating film 20, as depicted in FIG. 3B, developing parasitic capacitances.

Also in the case of FIG. 3B, however, the overlaps of the pattern on the insulating film 20 are smaller than in the conventional method which forms the gate electrode 19 by depositing the metal for forming the Schottky junction and patterning it after removing its unnecessary portion, as described previously with respect to FIG. 9. The reason for this is that the method of the present invention does not call for an allowance for mask alignment for the patterning of the metal layer 4 unlike in the case of the conventional method shown in FIG. 9. In the structure depicted in FIG. 3B, however, it is desirable, for further reduction of the parasitic capacitances, to prevent the gate electrode from overriding the insulating film.

To meet this requirement, it is necessary only to etch back the metal layer 5 to such a depth that its width a becomes equal to the foot width b of the recess in the insulating film 20. Thereafter, by selectively removing the underlying metal layer 4 through anisotropic etching, using the metal 5 (hatched with solid oblique lines), a patter shown in FIG. 3C can be obtained, in which the metals 4 and 5 are formed in the recess within its foot width b alone. As will be appreciated from the above, in the present invention the planarization of the overlying metal is means by which the end portions of the insulating layer and the marginal edges of the gate metal are substantially aligned with each other. There are cases where the above positioning can be achieved by such a planarization step alone, but when the positioning is insufficient only with the planarization step, the aforementioned etch-back or overetching step is carried out.

Figure 3C:
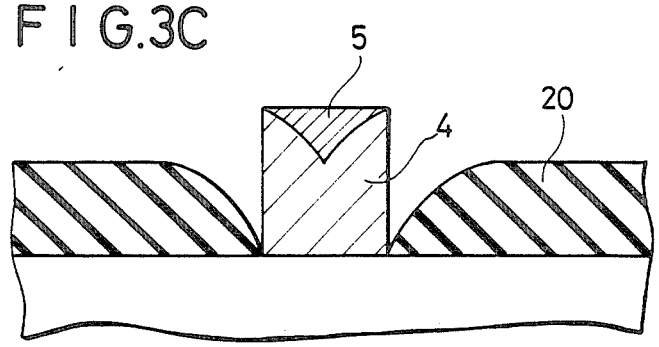

As will be evident from comparison of the structures shown in FIGS. 2A and 3C, the thickness of the overlying metal layer 5 relative to the thickness of the underlying metal layer 4 in FIG. 3C is smaller than in the case of FIG. 2A. This means that when a low resistance metal such as gold (Au) is used for the overlying metal layer 5, the effect of decreasing the resistance will be lessened accordingly.

It is therefore desirable that the recess or window made in the insulating film 20 have as steep side walls as possible.

It is also possible, in practice, to make sharp the cross-sectional profile of the recess by controlling the thickness of the underlying metal layer 4 and to etch back the overlying the metal layer 5, as referred to previously with regard to FIG. 3, thereby making the foot width b of the recess and the width a of the overlying metal layer 5 equal to each other.

FIG. 4 illustrates, in cross-section, a sequence of steps involved in the manufacture of a field effect transistor according to an embodiment of the present invention, in which the semiconductor substrate is a GaAs substrate.

Figure 4A:
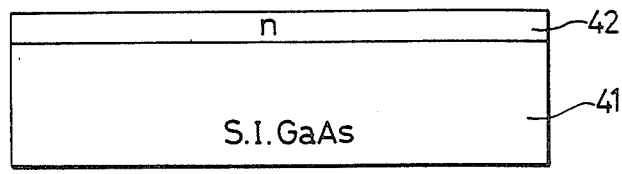
FIGS. 4A through G are cross-sectional views illustrating a sequence of steps involved in an embodiment of the present invention.
Figure 4B:
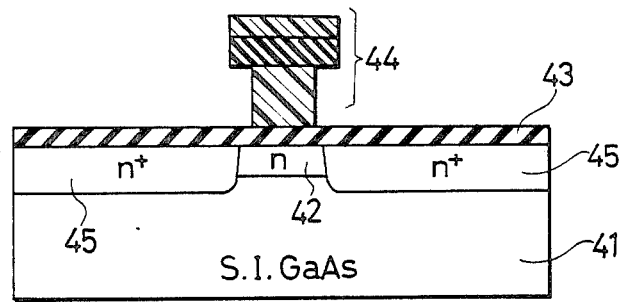
Figure 4C:
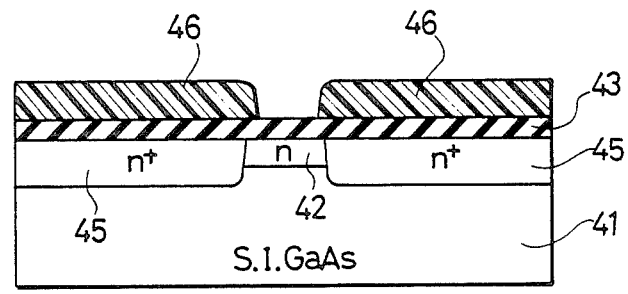

At first, for example, silicon which will act as an N type impurity is ion implanted into the main surface of a semi-insulating GaAs substrate 41 in a dose of $1 \times 10^{12}/cm^2$ under an acceleration voltage of 60 KeV, through a 1.2 μm thick photoresist film (not shown), thereby forming a primary ion-implanted layer 42 in the substrate 41 (FIG. 4A). Next, a silicon nitride film 43 is deposited 0.15 μm thick all over the main surface of the substrate 41 through the plasma CVD method, after which is formed by the reactive ion etching or the like a tri-level resist layer 44 which is open only at the portions corresponding to the substrate surface regions where the source and drain regions will ultimately be formed (in the same manner as in the case of FIG. 9B). Then, for example, silicon which will act as an N type impurity is ion implanted into the substrate 41 in a dose of $4 \times 10^{13}/cm^2$ under an acceleration voltage of 200 KeV, using the multi-level resist layer 44 as a mask, by which high impurity concentration ionimplanted layers 45 is formed (FIG. 4B). Following this, for instance, a SiO$_2$ film is deposited, by sputtering or the like, to a thickness of 3000 Å all over the main surface of the substrate 41 carrying the multi-level resist layer 44. Then the SiO$_2$ film on the multi-level resist layer 44 is lifted off together with the latter, thereby forming on the silicon nitride film 43 a SiO$_2$ film 46 of a pattern inverted from that of the lowermost resist film of the multi-level resist layer 44 (FIG. 4C). For activating the ion-implanted layers 42 and 45, the substrate assembly is annealed, for instance, in an N$_2$ atmosphere at 800° C. for 20 minutes.

Figure 4D:
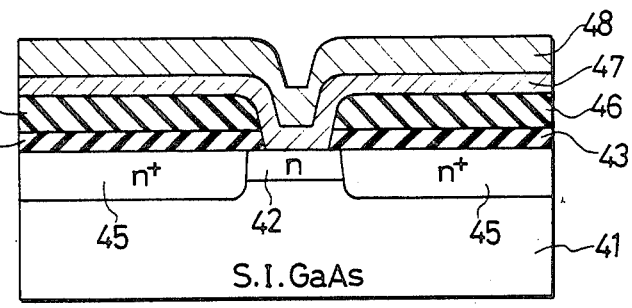
Figure 4E:
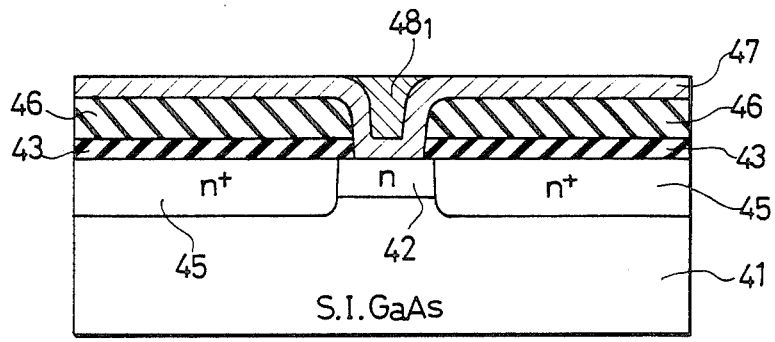

Next, the silicon nitride film 43 is selectively removed by plasma etching or reactive ion etching through the SiO$_2$ films 46, exposing the primary ion-implanted layer 42. A metal which forms a Schottky junction between it and the GaAs and can be removed by anisotropic etching, such as molybdenum (Mo), is deposited, by sputtering, to a thickness of 1500 Å all over the main surface of the substrate 41, as indicated by 47. Further, a metal which is capable of serving as a mask for the etching of the underlying metal layer 47, such as gold (Au), is deposited by sputtering to a thickness of 4000 Å all over the molybdenum layer 47, as indicated by 48 (FIG. 4D). Then the surface of the gold layer 48 is planarized. Several methods can be employed for the planarization. For example, the surface of the gold layer 48 is planarized by etching it back through an ion beam etching process in which beam incident angle is, for instance, 60° or more. As a result of this, the gold layer is left remaining only in the recessed region defined by the $SiO_2$ films 46, as indicated by $48_1$ (FIG. 4E).

Figure 6A:
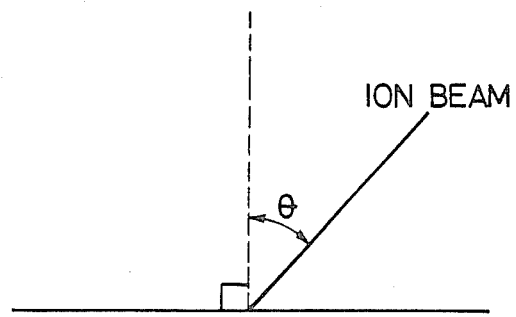
FIGS. 6A and B are a diagram for explaining the definition of an ion beam incident angle and a graph showing the relationship between the ion beam incident angle and the etching rate.
Figure 6B:
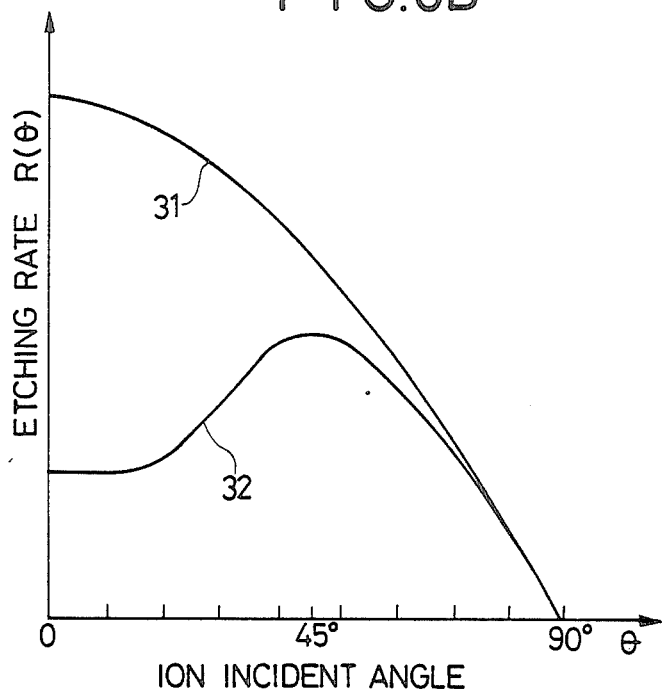
Figure 9A:
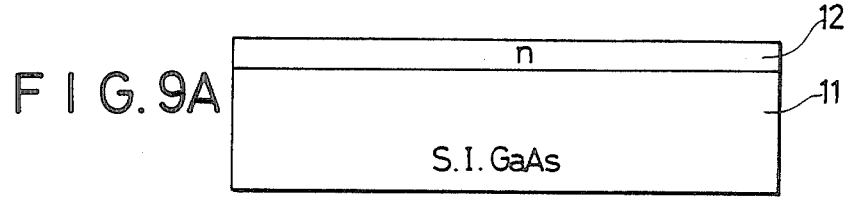
FIGS. 9A through D are cross-sectional views showing a sequence of steps involved in a conventional manufacturing method.
Figure 9B:
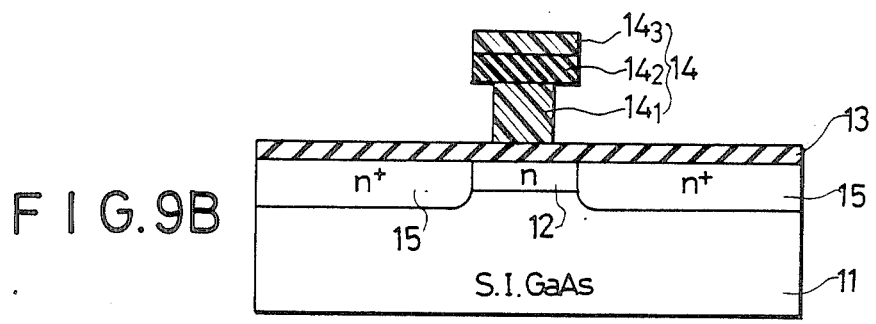
Figure 9C:
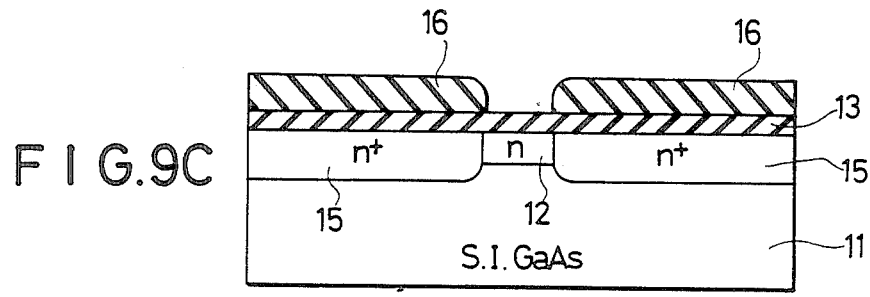
Figure 9D:
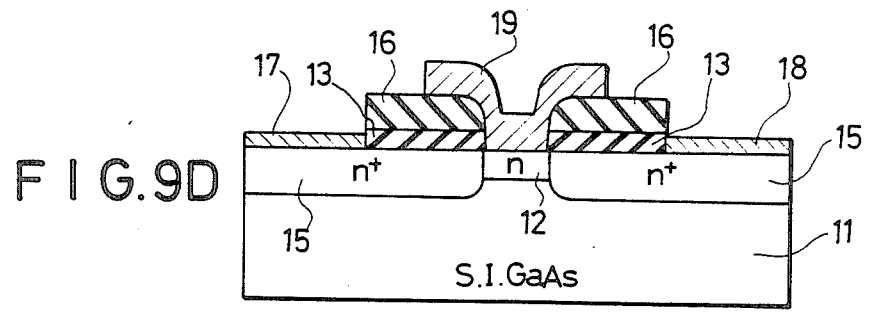
Figure 10:
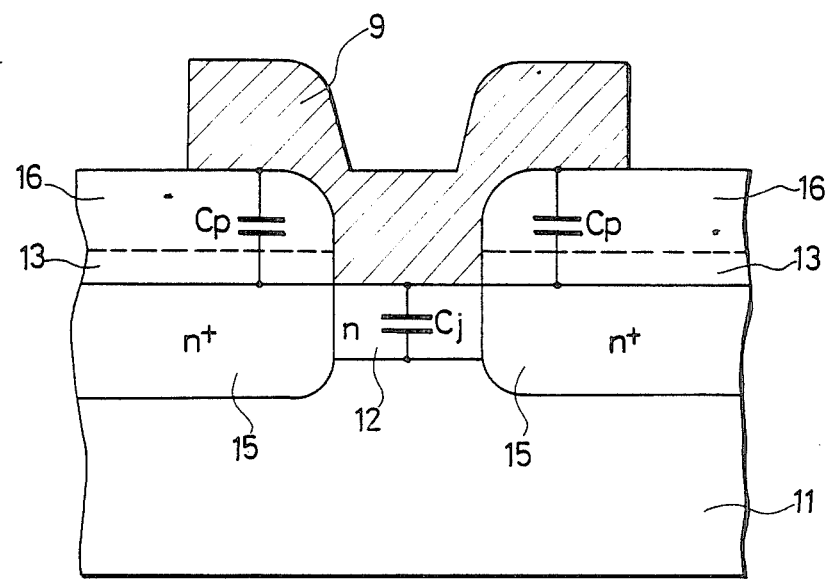
FIG. 10 is a schematic cross-sectional view illustrating a conventional device.

According to the above method, the convexity of the layer surface can selectively be etched away for planarization through utilization of the dependence of the etching rate upon the ion beam incident angle.

Where the ion beam incident angle is defined in terms of an angle $\theta$ to the normal to the substrate, as shown in FIG. 6A, the beam incident angle dependence of the etching rate by the ion beam etching differs with materials to be etched, which are roughly divided into those the etching rate of which is maximum when the ion beam is incident vertically thereto ($\theta=0$) (as indicated by 31 in FIG. 6B), such a gold (Au), and those the etching rate of which is maximum when the ion beam is incident in the range of $\theta=40°$ to 60° (as indicated by 32 in FIG. 6B), such a silicon (Si). In either case, when the ion beam incident angle $\theta$ is in excess of 60°, the etching rate decreases with an increase in the incident angle and becomes zero at 90°. Accordingly, in the case of etching back a layer having a surface step by an ion beam incident at an angle $\theta$, as depicted in FIG. 7, the incident angle $\theta$ to the slope of the surface step is smaller than the angle $\theta$ and there exists an incident angle $\theta$ at which the etching rate R ($\theta$) on the slope of the surface step is higher than the etching rate R ($\theta$) on the flat surface portion owing to the ion beam incident angle dependence of the etching rate and the shape of the surface step. By etching back at this incident angle the thin film of the convexity can selectively etched away (which etching will hereinafter be called diagonal ion beam etching).

FIG. 8 shows how the diagonal ion beam etching is carried out in an embodiment of the present invention, in which layer surfaces are planarized as indicated by i, ii, and iii.

Figure 4F:
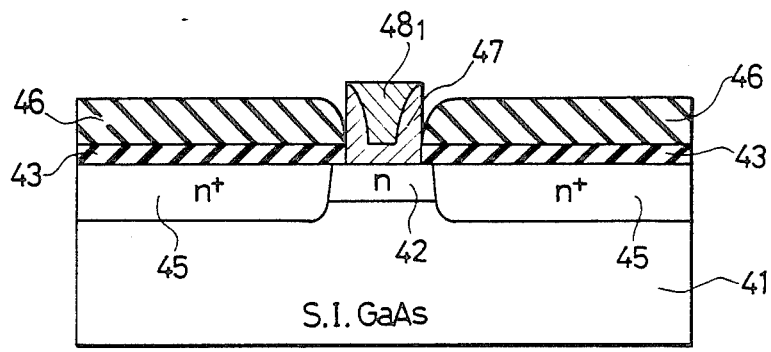

Turning back to FIG. 4, the underlying molybdenum (Mo) layer 47 is selectively etched away through the gold (Au) layer $48_1$ by reactive ion etching using $CF_4$ or $SF_6$ gas, thus forming a gate electrode (FIG. 4F).

Figure 4G:
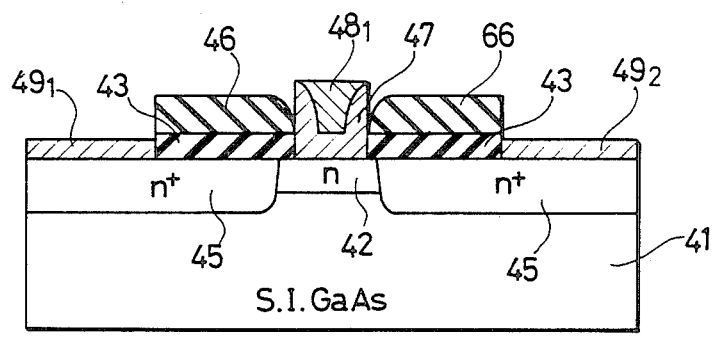
Figure 5A:
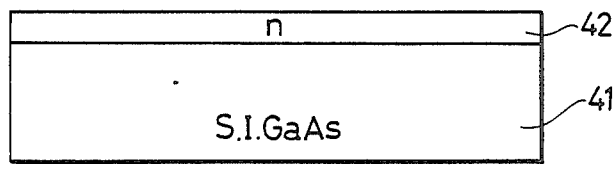
FIGS. 5A through D are cross-sectional views illustrating a sequence of steps involved in another embodiment of the present invention.
Figure 5B:
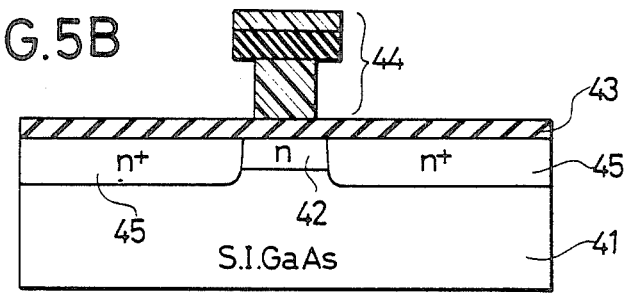
Figure 5C:
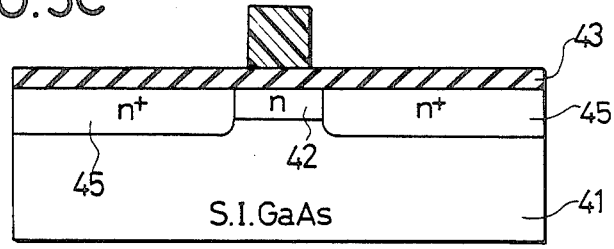
Figure 5D:
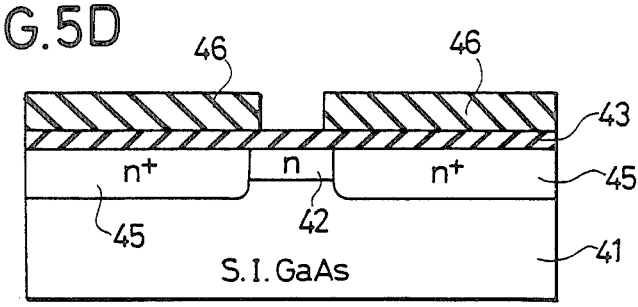

Next, a resist pattern which has openings at positions corresponding only to the portions where to form source and drain electrodes is deposited on the main surface of the substrate 41, though not shown, and then the $SiO_2$ films 46 and the silicon nitride films 43 are selectively removed by reactive ion etching and plasma etching, respectively, through the abovesaid resist pattern. Following this, an AuGe/Ni layer is vacuum evaporated as an ohmic metal layer to a thickness of 0.13 μm through utilization of the resist pattern as a mask and is then lifted off and the remaining portions of the layer are alloyed, forming source and drain electrodes $49_1$ and $49_2$ (FIG. 4G).

With the structure thus obtained, the gate electrode does not override the insulating films adjoining the gate and the inner ends of the aperture made in the insulating film and the outer side walls of the gate electrode portion are just in contact with each other; so that no parasitic capacitances are developed between the electrode portion and the channels. This ensures improvement of the high frequency and high speed characteristics of the device.

FIG. 5 illustrates another embodiment of the present invention. The structures depicted in FIGS. 5A and 5B are identical with those shown in FIGS. 4A and 4B and the same reference numerals are used. In FIG. 5C, the overhanging portion of the T-shaped multi-level resist layer 44 is removed, after which the $SiO_2$ film 46 is deposited by sputtering, as shown in FIG. 5D. In this instance, since the multi-level resist layer 44 has no overhanging portion, the inner marginal edges of the $SiO_2$ film 46 can be made sharper than in the case of the method described in connection with FIG. 4. This is advantageous for forming a thick low resistance gold (Au) layer in the subsequent steps (which are the same as those shown in FIGS. 4D through G), as mentioned previously with respect to FIG. 2.

While the above embodiments have been described to employ molybdenum (Mo) as the underlying metal which is capable of forming a Schottky junction between it and the semiconductor used and can be removed by anisotropic etching, it is possible, of course, to use other metals of similar functions, such as tantalum (Ta). Further, tungsten silicide and tungsten silicon nitride can also be utilized.

Although the present invention has been described in connection with its preferred embodiments, it is apparent that many modifications and variations may be effected without departing from the spirits of the present invention recited in the appended claims. According to the present invention, the self-aligned formation of the gate electrode of a field effect transistor sharply reduces or eliminates the overriding of the gate electrode metal on the adjoining insulating films, permitting a substantial reduction of the parasitic gate capactiance. Accordingly, the manufacturing method of the present invention offers an excellent field effect transistor possible of high frequency and high speed operation as compared with field effect transistors produced by prior art methods.

What is claimed is:

1. A method for the manufacture of a field effect transistor, comprising:

a step wherein a source region, a drain region, and an active region sandwiched therebetween are formed in the body of a semiconductor substrate near its one main surface and an insulating film of at least one layer deposited all over the main surface of the substrate is selectively removed, exposing a part of the active region formed in the semiconductor substrate;

a step wherein an underlying metal which forms a Schottky junction between it and the semiconductor of the active region and can be removed by anisotropic etching and an overlying metal of at least one layer which is capable of serving as a mask for the etching of the underlying metal are deposited in layers on the insulating film and the substrate surface exposed through the aperture made in the insulating film, filling the aperture with the underlying and the overlying metal;

as step wherein the surface of the overlying metal layer is planarized so that the overlying metal layer selectively remains in the aperture of the insulating film;

a step wherein the underlying metal layer is selectively removed by anisotropic etching through the remaining the overlying metal, forming a gate electrode of the overlying and underlying metal layers on the active region exposed through the aperture of the insulating film; and a step wherein the insulating film is partly removed and source and drain electrodes are formed on the source drain regions, respectively.

2. The manufacturing method according to claim 1 wherein the thickness of the overlying metal layer is controlled so as to control the width of the overlying metal layer remaining in the aperture of the insulating film.

3. The manufacturing method according to claim 1 wherein after the planarization of the overlying metal layer its surface is futher over-etched to back its upper marginal edges.

4. The manufacturing method according to claim 1 further including a step wherein a multi-level resist layer is formed on one main surface of the semiconductor substrate and patterned to expose the surface regions of the semiconductor substrate where the source and drain regions will ultimately be formed, an impurity which will form the source and drain regions is ion implanted using the multi-level resist layer as a mask, an insulating film is deposited on the main surface of the semiconductor substrate, and the insulating film overlying the multi-level resist layer is lifted off together with the latter, thereby leaving on the main surface of the semiconductor substrate the insulating surface in a pattern inverted from that of the lowermost resist film of the multi-level resist layer.

5. The manufacturing method according to claim 4 wherein overhanging portions of the multi-level resist layer are removed after the ion implantation of the impurity through the muli-level resist layer.

6. The manufacturing method according to claim 1 wherein the underlying metal layer is formed of molybdenum (Mo), tantalum (Ta), tungsten silicide, or tungsten silicon nitride.

* * * * *

UNITED STATES PATENT AND TRADEMARK OFFICE
CERTIFICATE OF CORRECTION

PATENT NO. : 4,694,564
DATED : Sept. 22, 1987
INVENTOR(S) : Enoki et al.

It is certified that error appears in the above-identified patent and that said Letters Patent is hereby corrected as shown below:

FRONT PAGE
[73] Assignee: Nippon Telegraph & Telephone Corporation
Tokyo, Japan
Col. 2, line 54, "bwtween" s/b --between--.
Col. 3, line 30, "th" s/b --the--;
line 60, "conjuncion" s/b --conjunction--.
Col. 4, line 31, "depostion" s/b --deposition--.
Col. 4, line 46, "ovelying" s/b --overlying--.
Col. 5, line 1, "colective" s/b --collective--;
Col. 5, line 68, "patter" s/b --pattern--.
Col. 6, line 51, "ionimplanted" s/b --ion implanted--.

Signed and Sealed this

Twenty-second Day of March, 1988

Attest:

DONALD J. QUIGG

*Attesting Officer*  *Commissioner of Patents and Trademarks*